(12) United States Patent
Mihajlovic et al.

(10) Patent No.: US 9,099,119 B2
(45) Date of Patent: Aug. 4, 2015

(54) MAGNETIC READ SENSOR USING SPIN HALL EFFECT

(71) Applicant: HGST Netherlands B.V., Amsterdam (NL)

(72) Inventors: Goran Mihajlovic, San Jose, CA (US); Petrus A. Van Der Heijden, Cupertino, CA (US)

(73) Assignee: HGST Netherlands B.V., Amsterdam (NL)

( * ) Notice: Subject to any disclaimer, the term of this patent is extended or adjusted under 35 U.S.C. 154(b) by 63 days.

(21) Appl. No.: 13/764,600

(22) Filed: Feb. 11, 2013

(65) Prior Publication Data
US 2014/0226239 A1    Aug. 14, 2014

(51) Int. Cl.
G11B 5/127    (2006.01)
G11B 5/37    (2006.01)
H01L 43/06    (2006.01)
G01R 33/07    (2006.01)
G01R 33/12    (2006.01)

(52) U.S. Cl.
CPC ............... G11B 5/374 (2013.01); G01R 33/07 (2013.01); G01R 33/1284 (2013.01); H01L 43/06 (2013.01)

(58) Field of Classification Search
USPC ........................................................ 360/112
See application file for complete search history.

(56) References Cited

U.S. PATENT DOCUMENTS

| | | | |
|---|---|---|---|
| 6,403,999 B1 * | 6/2002 | O'Handley et al. | 257/295 |
| 6,683,359 B2 * | 1/2004 | Johnson et al. | 257/421 |
| 6,700,761 B2 * | 3/2004 | Ihara et al. | 360/327 |
| 7,839,675 B2 | 11/2010 | Koo et al. | |
| 8,093,897 B2 | 1/2012 | Pan | |
| 8,295,006 B2 * | 10/2012 | Sugano et al. | 360/112 |
| 2009/0154030 A1 * | 6/2009 | Yamada et al. | 360/319 |
| 2009/0161265 A1 * | 6/2009 | Sugano et al. | 360/324 |
| 2012/0012956 A1 | 1/2012 | Saitoh et al. | |
| 2014/0001524 A1 * | 1/2014 | Manipatruni et al. | 257/295 |
| 2014/0056060 A1 * | 2/2014 | Khvalkovskiy et al. | 365/158 |

FOREIGN PATENT DOCUMENTS

WO    2008/044001 A3    4/2008

OTHER PUBLICATIONS

Fert, A., "The present and the future of spintronics," 2008 Elsevier B.V., Thin Solid Films, vol. 517, pp. 2-5.
Valenzuela, S. O., "Nonlocal Electronic Spin Detection, Spin Accumulation and the Spin Hall Effect," Mesoscale and Nanoscale Physics, Int. J. Mod. Phys. B. 23, 2413, 2009, pp. 1-25.

* cited by examiner

*Primary Examiner* — Wayne Young
*Assistant Examiner* — Carlos E Garcia
(74) *Attorney, Agent, or Firm* — Zilka-Kotab, PC

(57) ABSTRACT

A magnetic sensor utilizing the spin Hall effect to polarize electrons for use in measuring a magnetic field. The sensor eliminates the need for a pinned layer structure or antiferromagnetic layer (AFM layer), thereby reducing gap thickness for increased data density. The sensor includes a non-magnetic, electrically conductive layer that is configured to accumulate electrons predominantly of one spin at a side thereof when a current flows there-through. A magnetic free layer is located adjacent to the side of the non-magnetic, electrically conductive layer. A change in the direction of magnetization in the free layer relative to the orientation of the spin polarized electrons causes a change in voltage output of the sensor.

10 Claims, 8 Drawing Sheets

MAGNETIC READ SENSOR USING SPIN HALL EFFECT

FIELD OF THE INVENTION

The present invention relates to magnetic data recording and more particularly to a magnetic sensor that utilizes spin Hall effect to provide electron spin polarization.

BACKGROUND OF THE INVENTION

At the heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistance (GMR) sensor or a Tunneling Magnetoresistance (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the bit length in order to increase the linear data density. With regard to the magnetic head, this means reducing the shield to shield spacing of the read head (i.e. the read gap thickness). However, physical limitations as well as manufacturing limitations have constrained the amount by which the gap thickness of the magnetic read head can be reduced. For example current magnetic sensors require a pinned layer structure that includes two anti-parallel coupled magnetic layers with a non-magnetic layer sandwiched between them and an antiferromagnetic (AFM) material layer to pin one of the magnetic layers. This pinned layer structure consumes a large amount of the gap budget and greatly impedes efforts to reduce the gap thickness (and consequently the bit length) of the recording system. Therefore, there remains a need for magnetic sensor design that can provide the reduced gap thickness needed for future magnetic recording requirements.

SUMMARY OF THE INVENTION

The present invention provides a magnetic sensor that includes a magnetic free layer and a non-magnetic, electrically conductive layer formed adjacent to the magnetic free layer. The non-magnetic, electrically conductive layer is configured to accumulate spin polarized electrons at a side thereof based on a spin Hall effect when an electrical current flows through the non-magnetic, electrically conductive layer.

The magnetic free layer can be in direct contact with the non-magnetic, electrically conductive layer, which generates an electric potential at the interface between the magnetic free layer and the non-magnetic, electrically conductive layer. This electrical potential changes in response to changes in the direction of magnetization of the magnetic free layer relative to the spin polarization of electrons in the non-magnetic, electrically conductive layer.

Alternatively, a thin-non-magnetic barrier layer may be placed between the magnetic free layer and the non-magnetic, electrically conductive layer. The electrical potential across the non-magnetic barrier layer changes in response to changes in the direction of magnetization of the magnetic free layer. The use of a non-magnetic barrier layer can increase the electrical potential difference across the junction formed by the magnetic free layer and the non-magnetic, electrically conductive layer.

In another possible embodiment of the invention, a pair of anti-parallel coupled magnetic free layers can be used, with the non-magnetic, electrically conductive layer being located between the magnetic free layers. The use of two magnetic free layers, essentially doubles the signal output, but also increases the gap thickness somewhat.

The sensor using the spin Hall effect to polarize electrons greatly reduces the gap thickness by eliminating the need for a thick pinned layer structure and AFM layer. In addition, the invention eliminates any problems associated with loss of pinning, since the sensor eliminates the need for a pinned layer structure.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
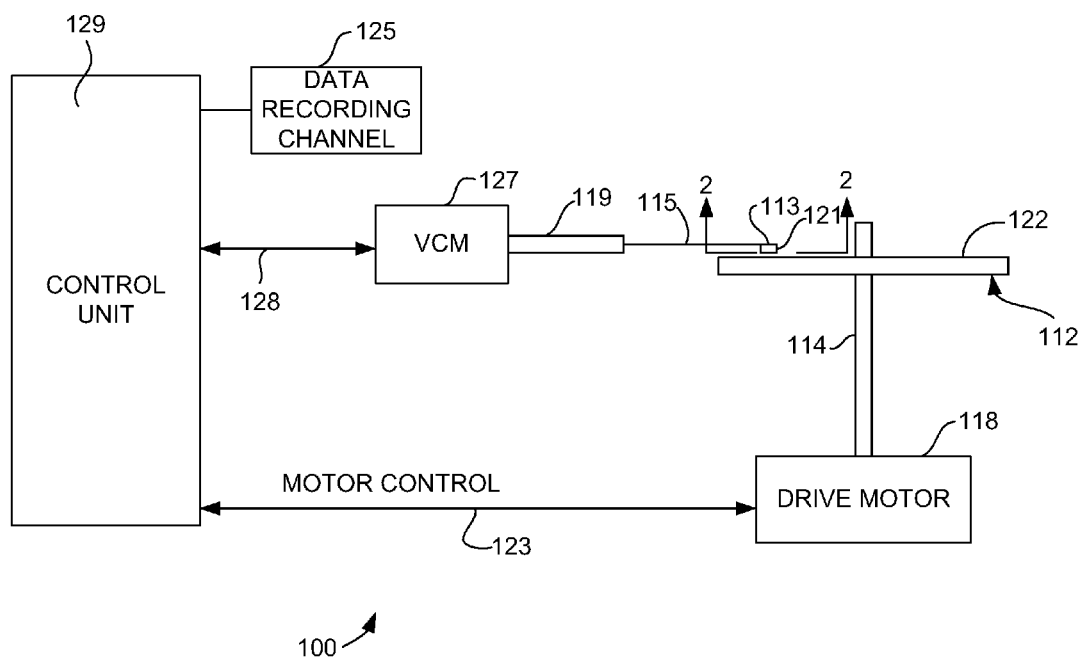
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
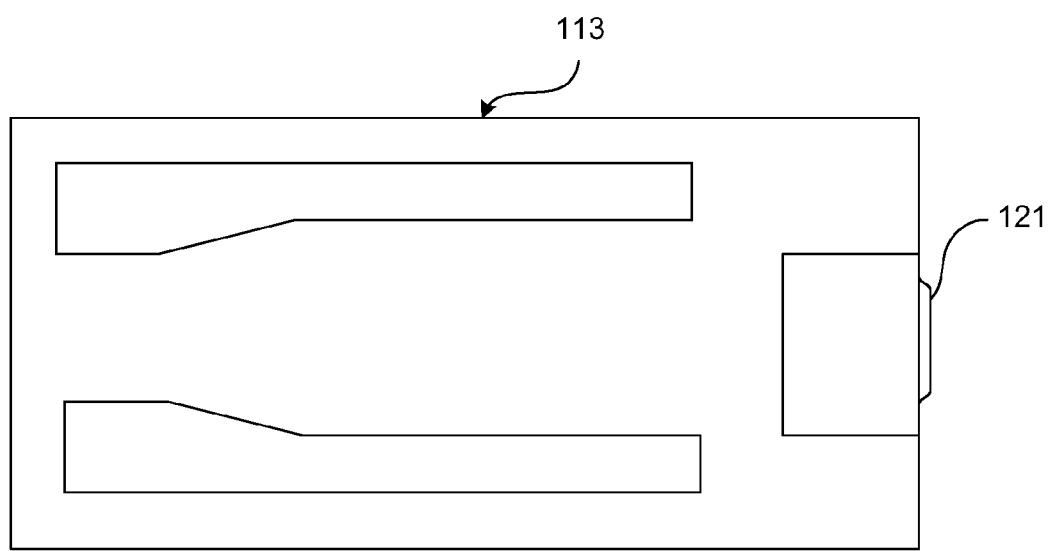
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head, including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

As discussed above, in order to increase data density it is necessary to decrease the read gap. The read gap is the spacing between magnetic shields of the read sensor and determines the down-track resolution. Currently used magnetic sensors such as giant magnetoresistance sensors (GMR) and tunneling magnetoresistance sensors (TMR) require a pinned layer structure, a free layer structure and a non-magnetic spacer or barrier layer sandwiched between the pinned and free layer structures.

Figure 7:
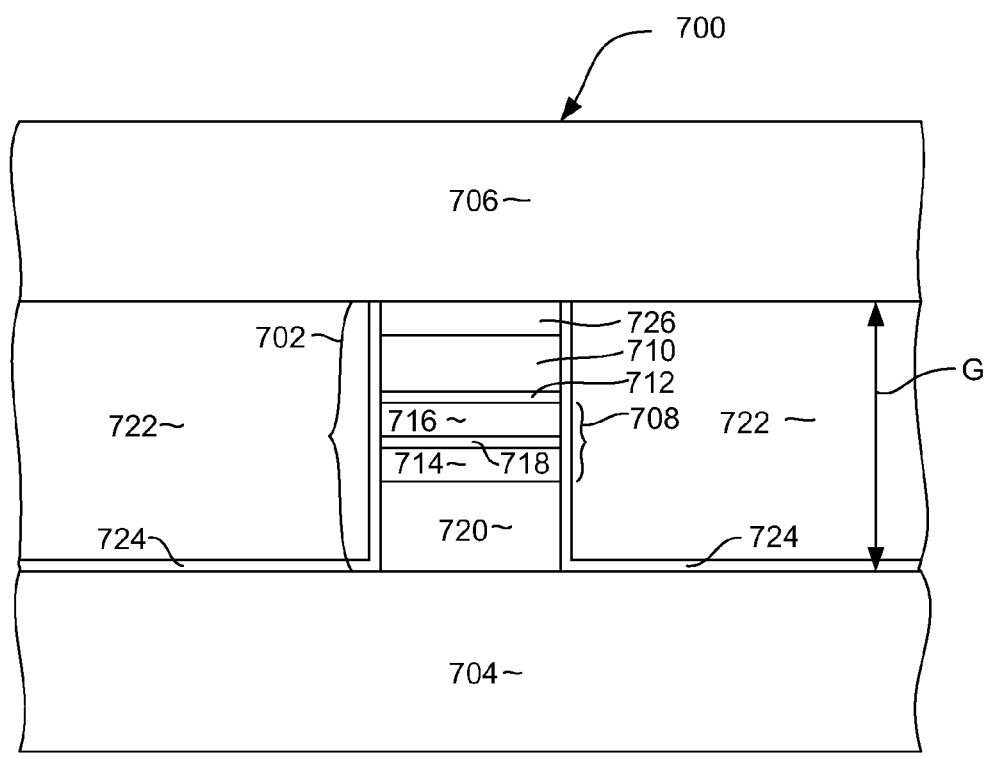
FIG. 7 is a schematic air bearing surface view of a prior art magnetic read sensor.

An example of such a GMR or TMR sensor is illustrated with reference to FIG. 7. FIG. 7 shows a read element 700 that includes a sensor stack 702 sandwiched between first and second magnetic shields 704, 706, that also function as leads. The distance between the shields 704, 706 defines the gap thickness G. The sensor stack includes a pinned layer structure 708, a free layer structure 710 and a non-magnetic spacer or barrier layer 712 sandwiched between the free layer structure 710 and pinned layer structure 708. If the read element 700 is a GMR sensor, then the layer 712 will be a non-magnetic electrically conductive layer such as Cu. If the read element 700 is a TMR sensor, then the layer 712 will be a thin, non-magnetic, electrically insulating barrier layer.

The free layer 710 has a magnetization that is biased in a direction parallel with the air bearing surface. Magnetic biasing is provided by hard magnetic bias layers 722 located at either side of the sensor stack. The hard bias layers 722 are separated from the sensor stack 702 and from at least one of the shields by a thin electrically insulating layer 724 that can be constructed of a material such as alumina. A capping layer 726 can be provided at the top of the sensor stack 702 to protect the under-lying layers during manufacture and to magnetically de-couple the free layer 710 from the upper shield 706.

The pinned layer structure 708 includes first and second magnetic layers 714, 716 that are anti-parallel coupled across a non-magnetic, anti-parallel coupling layer such as Ru 718. The first magnetic layer 714 is exchange coupled with a layer of antiferromagnetic material (AFM) such as IrMn or PtMn 720. In order for the magnetic/AFM coupling to exhibit the necessary pinning strength, the AFM layer 720 must be relatively thick. As can be appreciated, the pinned layer structure 708 and AFM 720 consume a large amount of read gap. In addition, in a current-perpendicular-to-the-plane (CPP) GMR sensor a large fraction of the signal is generated and sensed in the bulk of the magnetic layers. As a consequence, the thickness of the magnetic layers (both in the pinned layer structure and free layer) needs to be long enough compared to the spin diffusion length of the magnetic layers to obtain a sizable signal. This poses limitations on the minimum thickness of these layers.

In addition, the lithographic control of the reader width is more difficult with thicker structures. Thus, a thinner reader would also beneficial for achieving narrower track-widths which minimizes side reading and enables higher areal density magnetic recording.

Figure 3:
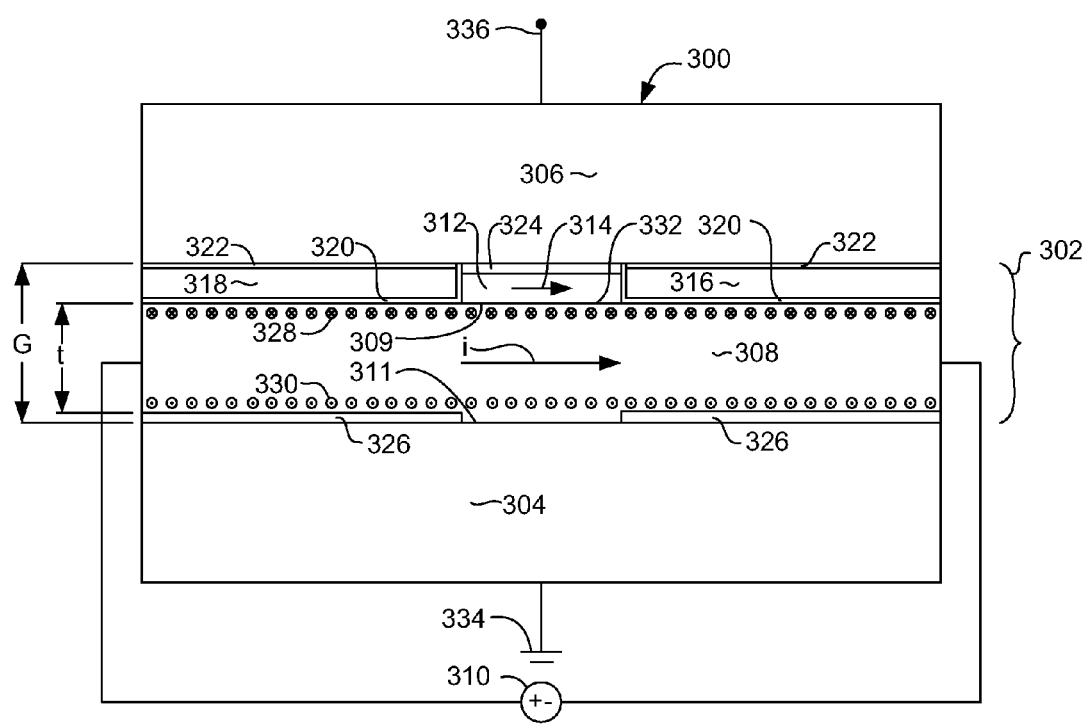
FIG. 3 is a schematic air bearing surface view of a magnetic read sensor according to an embodiment of the invention.

FIG. 3 shows a schematic view of a magnetic read head 300 according to a possible embodiment of the invention as viewed from the air bearing surface. The read head 300 operates in a fundamentally different manner than the previously described GMR or TMR sensor, and as can be seen, the read head 300 requires no pinned layer structure. Therefore, the sensor 300 can be made to have a much smaller gap thickness G than has previously been possible using conventional GMR or TMR sensor structures.

The sensor 300 includes a sensor stack 302 that is sandwiched between first and second magnetic shields 304, 306. The shields 304, 306 can be constructed of a material such as Ni—Fe. The distance between the shields determines the read gap thickness G. The sensor stack 302 includes a non-magnetic, conductive layer 308 having a top side 309 and bottom side 311, which can be constructed of a material such as platinum (Pt), tantalum (Ta), tungsten (W), or any other non-magnetic metal or alloy that has a large spin Hall angle of at least 0.1 and which exhibits large spin Hall effect. The non-magnetic conductive layer is connected with current source 310 that causes an electrical current i to flow through the electrically conductive, non-magnetic layer 308.

A magnetic free layer 312 is formed adjacent to the non-magnetic electrically conductive layer 308. The magnetic free layer 312 can be formed of one or more layers of magnetic material, such as Co—Fe, Ni—Fe, and or a Heusler alloy. The magnetic free layer 312 has a magnetization that is biased in a direction that is parallel with the air bearing surface as indicated by arrow 314, but which is free to move in response to a magnetic field (such as from a nearby magnetic media). The magnetization 314 of the magnetic free layer can be biased by a magnetic bias field provided by first and second hard magnetic bias layers 316, 318, which can be constructed of a high magnetic coercivity material such as CoPt or CoPtCr. The hard magnetic bias layers 316, 318 are separated from the non-magnetic, electrically conductive layer 308 by thin insulation layers 320, which can be constructed of a material such as alumina. A hard bias capping layer 322 such as Rh or some other material can be provided over the top of each of the hard bias layers 316, 318. A capping layer 324 such as Ta can be provided over the top of the magnetic free layer 312. In addition, optional insulation layers 326 can be provided between the non-magnetic, electrically conductive layer 308 and the adjacent shield 304. The insulation layers 326 can be constructed of a material such as alumina and can be formed with an opening in the region beneath the free layer 312 so that only laterally extending portions are insulated. These insulation layers 326 can be used to minimize the flow of electrons through the shield in a direction parallel with the non-magnetic, electrically conductive layer 308, and thus maximize the current density through the active non-magnetic layer 308. The insulation layers 326 are, however, optional.

The sensor 300 operates based on the spin Hall effect. When the electrical current i flows through the non-magnetic conductor 308, the spin Hall effect causes the spins of electrons in the non-magnetic conductor 308 to become polarized as shown. Electrons predominantly of one spin will accumulate at the first (e.g. top) side 309 of conductive layer 308, whereas electrons of an opposite spin will accumulate at the second (e.g. bottom) side 311. This is indicated by arrow tail symbols 328 at the top of the layer 308 and arrow head symbols 330 at the bottom of the layer 308. These electron spins are oriented perpendicular to the current flow i and perpendicular to the page in FIG. 3.

It can be seen then, that the magnetization 314 of the magnetic free layer 312 is biased in a direction perpendicular to the direction of the spins 328 of the non-magnetic layer adjacent to the free layer 312. Since the magnetic free layer 312 is adjacent to the non-magnetic layer 308, there is an interface 332 between the free layer and the non-magnetic layer 308. Because of the spin polarization of the electrons 328 and magnetization 314 of the free layer 312, a spin dependent electrical potential exists across the interface 332. This electrical potential varies in response to changes in the direction of magnetizations 314 of the free layer 312 relative to the spin polarity of the electrons 328 in the non-magnetic conductive layer 308. If one of the shields 304 is connected to ground 334 and the other shield 306 is connected with a voltage detector 336, the change in the voltage across the interface 332 can be read as a signal indicating a change in a nearby magnetic field, (such as from a magnetic media).

It can be seen, therefore, that the non-magnetic layer 328 provides spin polarized electrons that would otherwise be provided by a pinned layer structure described above with reference to FIG. 7. However, the non-magnetic layer 308 can be made much thinner than the thick pinned layer structure 708 and AFM layer 720 of FIG. 7, which are required in prior art GMR and TMR sensors. Therefore, the gap thickness G can be greatly reduced.

Figure 8:
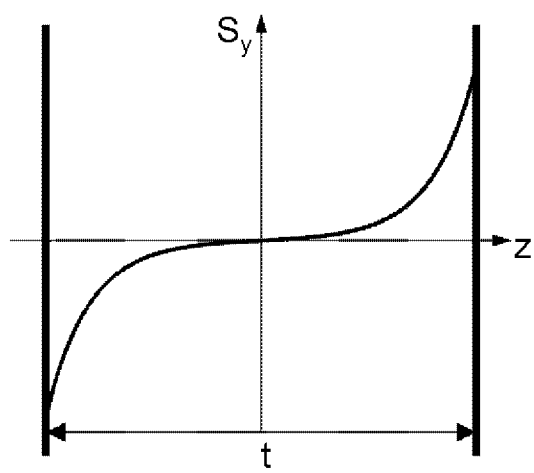
FIG. 8 is a graph illustrating spin polarization density as a function of conductor thickness.

Spin polarization is generated on the surface of a non-magnetic conductor utilizing spin Hall effect. When electrical current of a density j is applied in an x direction through the conducting layer of a thickness t (FIG. 3) measured in the z direction, the spin orbit coupling of electrons scatters y spins of opposite orientation in opposite directions along the z direction. The same is true for z spins along the y direction, but that is not relevant to the sensor 300. This effect results in a distribution of y spin polarization density along the z direction, with zero value at the conductor center and maxima of opposite polarization direction at the top and the bottom surfaces as shown in FIG. 8 for the case when $t/2L_s=10$, where $L_s$ is the spin diffusion length in the non-magnetic conductor. It should be pointed out that the surfaces can have polarization directions opposite to that shown in FIG. 3, depending on the sign of the spin-orbit coupling material. The physics of the effect is discussed in detail in M. I. Dyakonov and V. I. Perel, JETP Lett. 13, 467 (1971); M. I. Dyakonov, Phys. Rev. Lett. 99 126601 (2007). The effect has been experimentally verified in both metals and semiconductors. The magnitude of the spin polarization density along the z direction is given as:

$$S_y(z) = \frac{\gamma L_S}{D} \frac{\sinh(z/L_S)}{\cosh(t/2L_S)} \frac{j}{e}, \quad \text{(Equation 1)}$$

where γ is the spin Hall angle, $L_s$ is the spin diffusion length, D is the diffusion coefficient and e is the electron charge. FIG. 8 shows an example of $S_y(z)$ distribution through the thickness of the non-magnetic conductor for the case $t/2L_s=10$. When t is much greater than $2L_s$ ($t \gg L_s$) the maximum $S_y$ can be obtained at the top and the bottom surfaces:

$$S_y(\pm t/2) = \frac{\gamma L_S}{D} \frac{j}{e}.$$

When $t=2L_S$ $S_y(\pm t/2)$ is about ¾ of this maximum value.

The spin polarization density generated on the surface of a non-magnetic conductor via the spin Hall effect can be transformed into an effective electrical voltage when adjacent to a magnetic layer, such as the magnetic free layer 312 of FIG. 3. More specifically, the spin polarization density induces a spin dependent chemical potential (spin accumulation) that given by:

$$\mu_s = S_y/N(E_F)$$

where $N(E_F)$ is the electron density of states at the Fermi level.

When the conductive layer (e.g. layer 308) is in contact with a ferromagnetic layer (e.g. free layer 312) the electric potential $$\phi_s = (\vec{P} \cdot \hat{y})\mu_s/e$$

is generated across the interface 332 between the conductor 308 and magnetic layer 312. In the above equation $\vec{P}=P \cdot \hat{m}$ is the interfacial spin polarization vector ($\hat{m}$—unit vector in the direction of magnetization of the magnetic layer 318; $\hat{y}$—unit vector in the direction of the reference surface spin polarization density). The potential difference between parallel and anti-parallel orientations of $\vec{P}$ and $\hat{y}$ is $$\Delta V = 2P\frac{\mu_S}{e}$$

For a non-magnetic conductor 308 of a thickness t and taking into account the Einstein diffusion equation, $N(E_F)=(e^2D\rho)^{-1}$ where $\rho$ is the resistivity of the non-magnetic conductor 308 the above equation becomes $$\Delta V = 2PL_S\gamma\rho j \tan h(t/2L_S)$$

Therefore, it can be seen that the spin Hall effect results in a voltage being generated across the interface between the conductive layer 308 and the magnetic free layer 314, and that this voltage depends upon the orientation of the magnetization 314 of the free layer 312 relative to the spin polarization 328 at the interface 332. This voltage potential can then be measured as a signal in response to a magnetic field, such as from a magnetic media.

Figure 4:
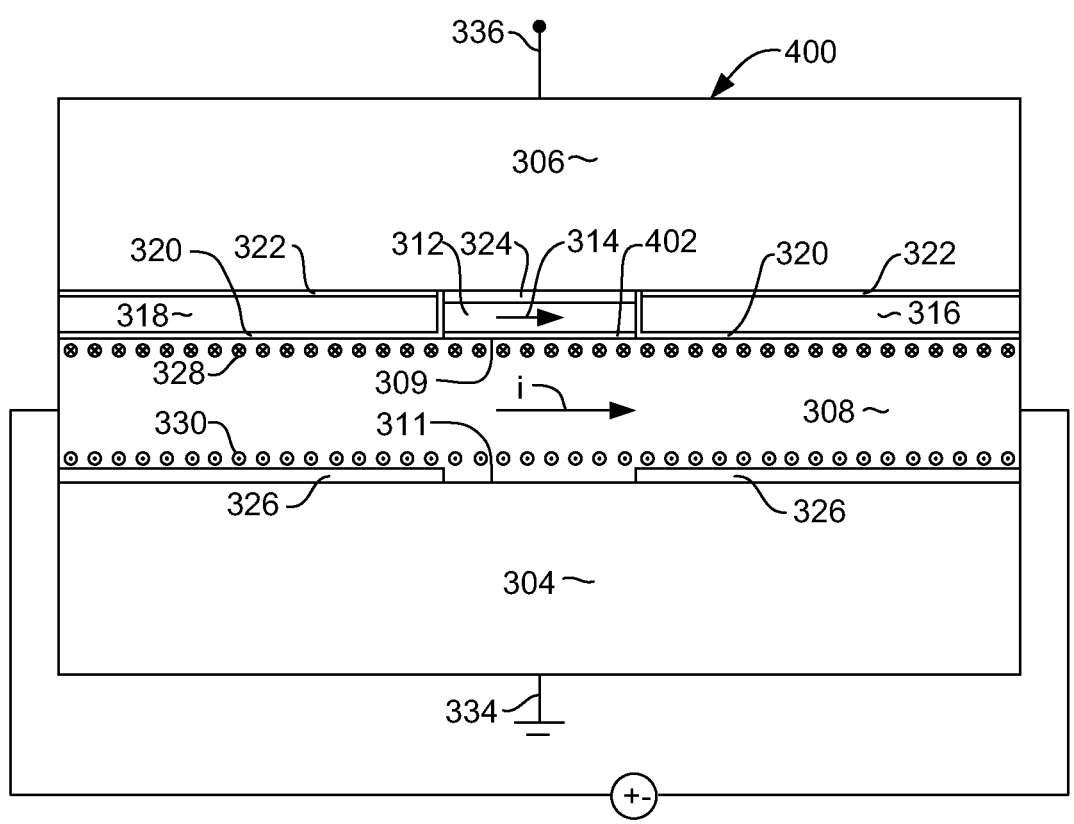
FIG. 4 is a schematic air bearing surface view of a magnetic read sensor according to an alternate embodiment of the invention.

With reference now to FIG. 4 a magnetic sensor 400 according to another possible embodiment of the invention is described. The sensor 400 is similar to the sensor 300 of FIG. 3, except that a non-magnetic, electrically insulating barrier layer 402 is inserted between the non-magnetic, electrically conductive layer 308 and the magnetic free layer 312.

The presence of the barrier layer 402 may maximize the parameter P in the above equations. The barrier layer also maximizes the current density near the surface of the non-magnetic, electrically conductive layer 308 and thus maximizes reference spin polarization density. This embodiment, having a barrier layer 402, functions similarly to a tunneling (TMR) sensor, with major difference that electrical current does not flow through the barrier layer 402 and the free layer 312. This can provide improved reliability and durability over TMR sensors. The voltage across the barrier layer 402 changes depending upon the orientation of the magnetization 314 of the free layer 312 relative to the polarization of spin 328 in the conductive layer. In this embodiment, the spin polarization 328 is provided by the spin Hall effect, rather than by passing a current through a magnetic pinned layer structure as would be the case in a typical TMR sensor.

Figure 6:
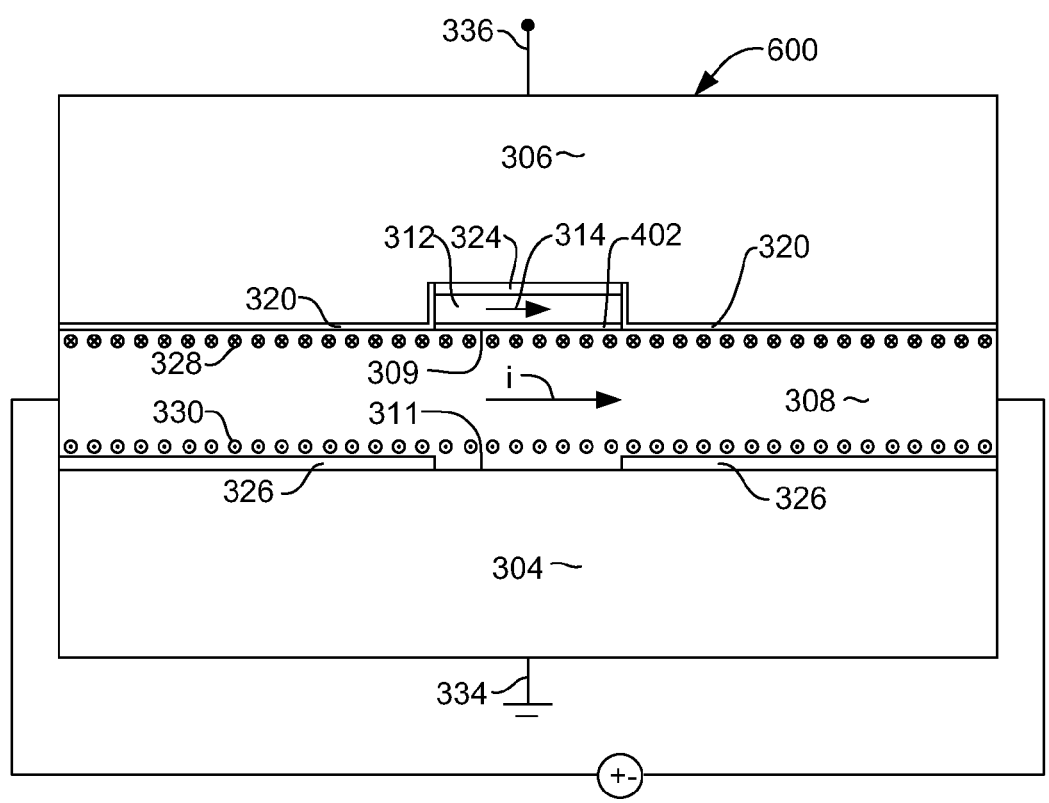
FIG. 6 is a schematic air bearing surface view of a magnetic read sensor according to still another embodiment of the invention.

FIG. 6 shows an embodiment of a sensor 600 that is similar to that of FIG. 4, except that it requires no hard bias structures at the sides of the free layer 312. Instead, the shield 306 extends down adjacent to the sides of the free layer 312 to provide a side shielding function. In a sensor where hard bias layers are not needed at the sides of the free layer 312, the presence of such side shielding helps to better define and reduce the cross-track resolution of the sensor 600.

Figure 5:
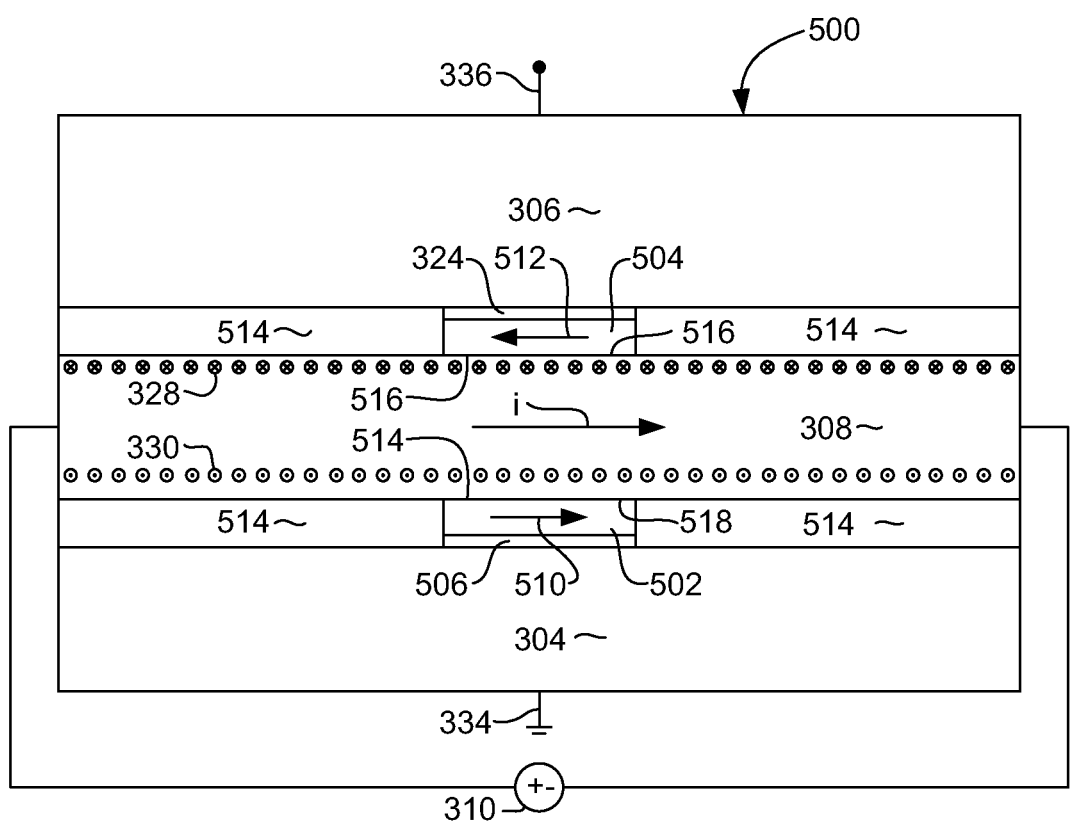
FIG. 5 is a schematic air bearing surface view of a magnetic read sensor according to yet another embodiment of the invention.

With reference now to FIG. 5, a magnetic sensor 500 according to yet another embodiment of the invention is described. This embodiment includes a pair of anti-parallel coupled magnetic free layers 502, 504 located on opposite one another across the non-magnetic, electrically conductive layer 308. The sensor can also include a capping layer 324 at the top of the one of the magnetic layers 504 and a seed layer 506 at the bottom of the other free layer 502. The seed layer 506 can help to initiate a desired grain structure in the above deposited free layer 502.

The free layers 502, 504 have magnetizations 510, 512 that are oriented parallel with the air bearing surface and anti-parallel to one another. The anti-parallel coupling of the layers 502, 504 can come from magneto-static coupling or exchange coupling between the magnetic free layers 502, 504. Furthermore, the magnetic layers 502, 504 can be constructed such that magnetic anisotropy in the magnetic layers 502, 504 causes them to naturally align in a direction parallel with the air bearing surface as shown. While the magnetizations 510, 512 tend to align in this anti-parallel manner, they are free to move in response to a magnetic field, such as from a nearby magnetic media. When the magnetizations 510, 512 move they do so in a scissor-like fashion. For instance they could both move into the plane of the page or out of the plane of the page in unison in FIG. 5.

Because of the anti-parallel coupling and shape enhanced magnetic anisotropy a hard bias structure such as that described above may be unnecessary in this embodiment. Therefore, the areas laterally beyond the magnetic free layers 502, 504 (between each shield 304, 306 and the conductive layer 308) can be filled with a non-magnetic, electrically insulating material 514.

Because there are two free layers 502, 504, there are also two interfaces 516, 518 between the conductive layer 308 and each of the magnetic free layers 502, 504. In FIG. 5 it can be seen that, while the magnetizations 510, 512 are in opposite directions, the spin polarizations 328, 330 at the top and bottom of the conductor 308 are also in opposite directions. Therefore, the signal provided at both of the interfaces 514, 516 are additive. In this way, the output of the sensor can be effectively doubled.

It should be pointed out, also, that an embodiment (not shown) could be provided that includes features of both the embodiment of illustrated with reference to FIG. 5 and the embodiment illustrated with reference to FIG. 4. That is to say, an embodiment could be constructed with a pair of free layers 502, 504 as described with reference to FIG. 5, but also having a thin non-magnetic barrier layer (similar to barrier layer 402 of FIG. 4) between each of the magnetic free layers 502, 504 and the conductive layer 308.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor, comprising:
    a magnetic free layer wherein the magnetic free layer has a magnetization that is biased in a direction a parallel with an air bearing surface, but that is free to move in response to a magnetic field;
    a non-magnetic, electrically conductive layer formed adjacent to the magnetic free layer, and configured to accumulate spin polarized electrons at a side thereof based on a spin Hall effect when an electrical current flows through the non-magnetic, electrically conductive layer;
    circuitry connected with the non-magnetic, electrically conductive layer for supplying a current through the non-magnetic, electrically conductive layer; and
    circuitry connected to measure a change in electrical resistance between the magnetic free layer and the non-magnetic, electrically conductive layer.

2. The magnetic sensor as in claim 1, wherein the magnetic free layer and non-magnetic, electrically conductive layer define an interface there-between, and wherein the spin Hall effect results in an accumulation of spin polarized electrons at the interface.

3. The magnetic sensor as in claim 2, wherein the accumulation of spin polarized electrons at the interface results in a voltage potential difference between the electrically conductive, non-magnetic layer and the magnetic free layer, the voltage varying in response to a direction of magnetization of the magnetic free layer.

4. The magnetic sensor as in claim 1, further comprising:
first and second electrically conductive, magnetic shields arranged such that the non-magnetic, electrically conductive layer and the magnetic free layer are located between the first and second magnetic shields; and
wherein the circuitry configured to measure a change in electrical resistance across the magnetic free layer and the non-magnetic, electrically conductive layer is connected with at least one of the first and second electrically conductive shields.

5. The magnetic sensor as in claim 1, wherein the non-magnetic, electrically conductive layer comprises a material having a spin Hall angle of at least 0.1.

6. The magnetic sensor as in claim 1, wherein the non-magnetic, electrically conductive layer comprises one or more of Pt, Ta and W.

7. A magnetic sensor, comprising:
a non-magnetic, electrically conductive layer;
a magnetic free layer wherein the magnetic free layer has a magnetization that is biased in a direction parallel with an air bearing surface, but that is free to move in response to a magnetic field;
a non-magnetic, electrically insulating barrier layer sandwiched between the magnetic free layer and the non-magnetic, electrically conductive layer;
circuitry connected with the non-magnetic, electrically conductive layer for supplying a current through the non-magnetic, electrically conductive layer; and
circuitry connected to measure a change in electrical resistance between the magnetic free layer and the non-magnetic, electrically conductive layer;
wherein the non-magnetic, electrically conductive layer is configured to accumulate spin polarized electrons at a side thereof based on a spin Hall effect when an electrical current flows through the non-magnetic, electrically conductive layer.

8. The magnetic sensor as in claim 7, further comprising:
first and second electrically conductive, magnetic shields arranged such that the non-magnetic, electrically conductive layer and the magnetic free layer are located between the first and second magnetic shields; and
wherein the circuitry configured to detect a change in electrical resistance between the magnetic free layer and the non-magnetic, electrically conductive layer is connected with at least one of the first and second electrically conductive shields.

9. The magnetic sensor as in claim 7, wherein the non-magnetic, electrically conductive layer comprises a material having a spin Hall angle of at least 0.1.

10. The magnetic sensor as in claim 7, wherein the non-magnetic, electrically conductive layer comprises one or more of Pt, Ta and W.

* * * * *